United States Patent
Takahashi

(10) Patent No.: US 12,375,034 B2
(45) Date of Patent: Jul. 29, 2025

(54) SOLAR POWER GENERATION SYSTEM

(71) Applicant: TMEIC Corporation, Chuo-ku (JP)

(72) Inventor: Nobuhiro Takahashi, Tokyo (JP)

(73) Assignee: TMEIC CORPORATION, Chuo-ku (JP)

(*) Notice: Subject to any disclaimer, the term of this patent is extended or adjusted under 35 U.S.C. 154(b) by 660 days.

(21) Appl. No.: 16/972,253

(22) PCT Filed: Jun. 7, 2018

(86) PCT No.: PCT/JP2018/021902
§ 371 (c)(1),
(2) Date: Dec. 4, 2020

(87) PCT Pub. No.: WO2019/234886
PCT Pub. Date: Dec. 12, 2019

(65) Prior Publication Data
US 2021/0242829 A1    Aug. 5, 2021

(51) Int. Cl.
*H02S 40/42*    (2014.01)
*H02J 3/38*    (2006.01)
(Continued)

(52) U.S. Cl.
CPC ............ *H02S 40/425* (2014.12); *H02S 20/10* (2014.12); *H02S 40/30* (2014.12); *H02S 40/345* (2014.12);
(Continued)

(58) Field of Classification Search
CPC ........ H02S 20/10; H02S 40/30; H02S 40/345; H02S 40/425; H02S 40/44; H02S 10/30
See application file for complete search history.

(56) References Cited

U.S. PATENT DOCUMENTS

2010/0296276 A1* 11/2010 Bieri ................... F24S 10/75
126/622
2012/0075901 A1    3/2012 Ahangar et al.

FOREIGN PATENT DOCUMENTS

CN    105222258 A  *  1/2016
FR    2882426 A1 *  8/2006 ............ F24D 11/003
(Continued)

OTHER PUBLICATIONS

English machine translation of WO 2012/163705A2. (Year: 2012).*
(Continued)

*Primary Examiner* — Lindsey A Buck
(74) *Attorney, Agent, or Firm* — Oblon, McClelland, Maier & Neustadt, L.L.P.

(57) ABSTRACT

Through a power cable from a power collection box, a power conversion device receives DC power. The power conversion device converts the received DC power into AC power and transmits it to a power system. A plurality of air lead-in tubes are laid in parallel. Each of the air lead-in tubes includes a heat exchange part, an opening part, and a lead-in part. The heat exchange part is buried in a ground at a ground surface on a back surface of a solar cell panel. The opening part is exposed to the ground surface. The lead-in part is an opening that communicates with an interior of a building in which the power conversion device is installed. The air lead-in tubes are constructed to draw air in the heat exchange part from the lead-in part by using a sucking mechanism.

8 Claims, 5 Drawing Sheets

(51) Int. Cl.
    *H02S 20/10*         (2014.01)
    *H02S 40/30*         (2014.01)
    *H02S 40/34*         (2014.01)
    *H02S 40/44*         (2014.01)
    *H05K 7/20*          (2006.01)

(52) U.S. Cl.
    CPC ............... *H02S 40/44* (2014.12); *H02J 3/381* (2013.01); *H02J 2300/24* (2020.01); *H02J 2310/12* (2020.01); *H05K 7/20909* (2013.01)

(56)             References Cited

FOREIGN PATENT DOCUMENTS

| | | | |
|---|---|---|---|
| JP | 2011-23411 A | 2/2011 | |
| JP | 2016-133237 A | 7/2016 | |
| JP | 2018-42337 A | 3/2018 | |
| WO | WO-2012163705 A2 * | 12/2012 | ....... H01L 31/02008 |

OTHER PUBLICATIONS

English machine translation of Cn 105222258A. (Year: 2016).*
English machine translation of FR2882426A1. (Year: 2006).*
Indian Office Action issued Aug. 31, 2021 in Indian Patent Application No. 202017055315 (with English translation), 5 pages.
International Search Report issued on Aug. 21, 2018 in PCT/JP2018/021902 filed on Jun. 7, 2018, 1 page.

* cited by examiner

SOLAR POWER GENERATION SYSTEM

FIELD

This application relates to solar a power generation system.

BACKGROUND OF INVENTION

Conventionally, for example, as disclosed in JP2016-133237A, an air conditioning system which is constructed so as to take in air having stable temperature via a heat exchange tube buried in earth and sand etc. is known. The air conditioning system of the above publication is used for a purpose of preparing a living environment in a house.

CITATION LIST

Patent Literature

[PTL 1] JP2016-133237A

SUMMARY

Technical Problem

A power conversion device contained in the solar power generation system generates heat when a power converter is operated. A calorific value of the power conversion device is considerably larger than the calorific value assumed in the house as object in the above publication. In addition, an installation environment of the solar power generation system is various, and the power conversion device may be installed in a harsh temperature environment. The power conversion device is preferably used within a pre-designed rated temperature range, and is not preferably used at a temperature range that deviates significantly from an expected operating temperature range.

The present invention has been made to solve the above problem, and an object of the present invention is to provide the solar power generation system capable of managing temperatures of the power conversion device.

Solution to Problem

A solar power generation system according to the present invention comprising:
 a solar cell panel installed in a ground surface;
 a power conversion device which is configured to convert direct current power received from the solar cell panel via a power cable into alternate current power; and
 an air lead-in tube including: a heat exchange part which is laid on the ground surface in a shade on a back side of the solar cell panel or buried in a ground on the back side; an opening part which communicates with the heat exchange part and is exposed on the ground surface; and a lead-in part which communicates with the heat exchange part and opens inside the power conversion device or inside a building in which the power conversion device is installed, the air lead-in tube is constructed so as to draw air in the heat exchange part from the lead-in part by using sucking means.

Advantageous Effect of Invention

According to the present invention, it is possible to draw outside air having a stable temperature, which is less influenced by an outside air, into the power conversion device from the air lead-in tube which is laid in the shade generated by the solar panel or buried in the ground on the back side of the solar panel. As a result, it is possible to control temperature of the power conversion device.

EMBODIMENT OF INVENTION

Figure 1:
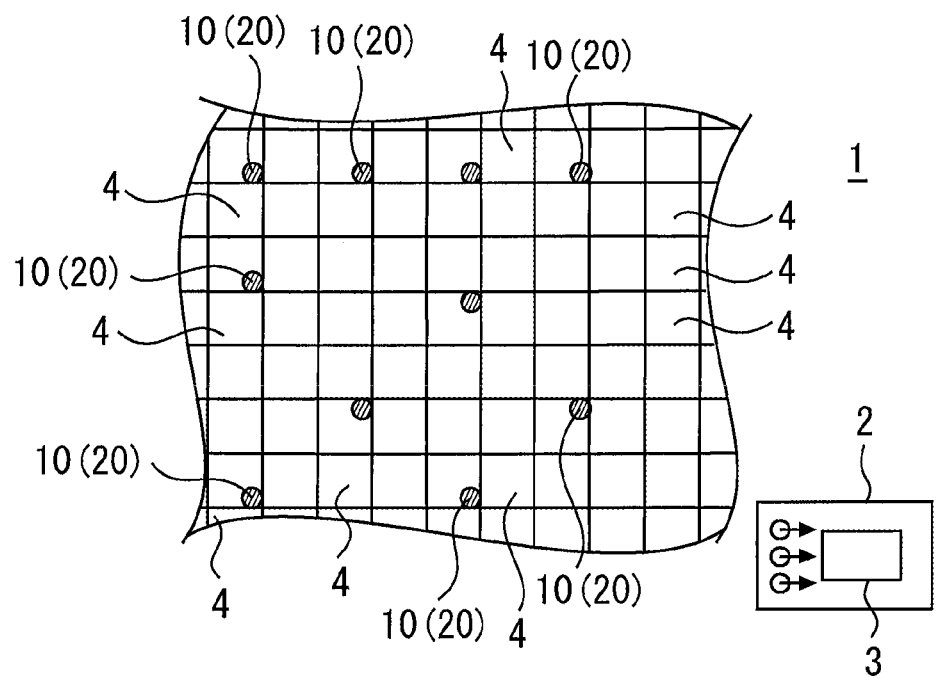
FIG. 1 is a plan view schematically showing a configuration of a solar power generation system according to an embodiment.

FIG. 1 is a plan view schematically showing a configuration of a solar power generation system 1 according to an embodiment. The solar power generation system 1 includes a plurality of solar cell panels 4, a power conversion device 3, a plurality of power collection boxes 10, and a plurality of air lead-in tubes 20. The plurality of solar cell panels 4 are installed in a base 5 to form sun cell arrays. The power conversion device 3 is stored in a building 2 such as a container house. One power collection box 10 is assigned to the plurality of solar cell panels 4. In the power collection box 10, cables of the assigned plurality of solar cell panels 4 are combined.

Figure 2:
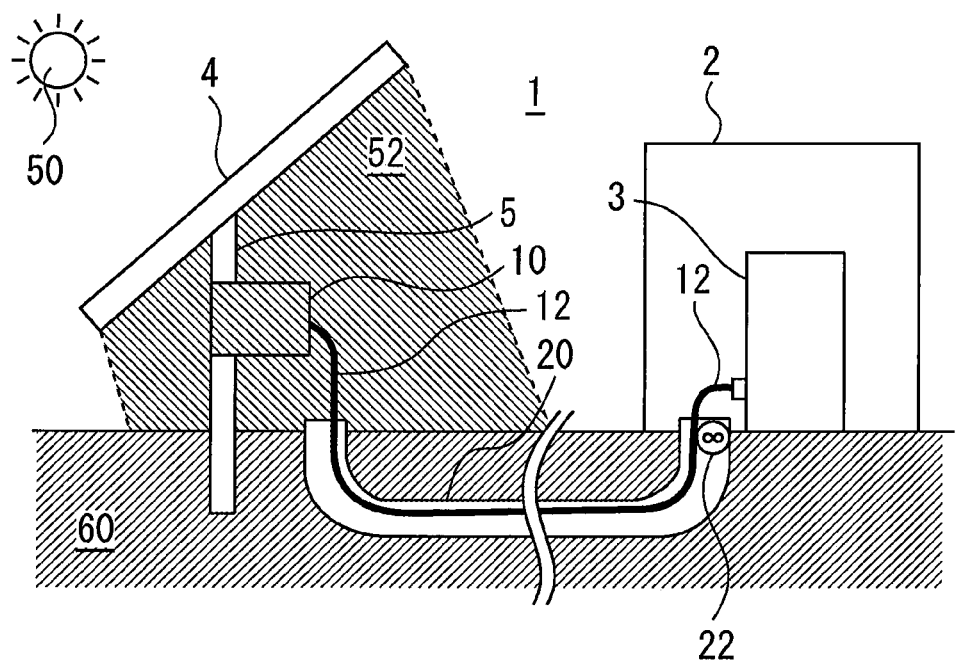
FIG. 2 is a side sectional view specifically showing the configuration of the solar power generation system according to the embodiment.

FIG. 2 is a side sectional view specifically showing the configuration of the solar power generation system 1 according to the embodiment. The plurality of solar cell panels 4 are installed in a ground surface. Cables of the plurality of solar cell panels 4 are grouped together in the power collection box 10. Through a power cable 12 from the power collection box 10, the power conversion device 3 receives direct current power. The power conversion device 3 converts the received direct current power into alternate current power and transmits it to a power system (not shown).

The air lead-in tubes 20 are buried in a ground 60 on a back surface of the solar cell panels 4. Although FIG. 2 shows only one of the lead-in tubes 20, in reality, the plurality of air lead-in tube 20 extend in parallel with each other in the ground 60 to reach the building 2. Each of the air lead-in tubes 20 includes a "heat exchange part", an "opening part", and a "lead-in part". The "heat exchange part" is a part buried in the ground 60 on the back surface of the plurality of solar cell panels 4 in the ground surface. The buried depth of the heat exchange part may be, for example, from 1 meter to 3 meter. The "opening part" is a part exposed to the ground surface. The "lead-in part" is an opening that communicates with an interior of the building 2 in which the power conversion device 3 is installed. The air lead-in tubes 20 are constructed so as to draw air in the heat exchange part from the "lead-in part" by using sucking means. As the sucking means, a lead-in fan 22 for circulating air inside the air lead-in tube 20 is provided.

On the back surface of the solar cell panels 4 that generates power with light of a sun 50, a shade 52 is generated. Outside air is introduced through the air lead-in tubes 20 buried in the ground 60 in the shade 52. Since the temperature of the ground 60 is stable, it is possible to draw air having a stable temperature into the power conversion device 3 from the air lead-in tubes 20 that are buried in the ground 60. Therefore, it is possible to manage the temperature of the power conversion device 3 without relying on an air conditioning equipment.

That is, the "heat exchange parts" of the air lead-in tubes 20 are buried in the ground 60 at a depth equal to or greater than 1 meter. At a site that reaches a depth of 1 meter or more in the ground 60, there is a temperature difference of 10° C. (degrees centigrade) or more as compared to the outside air, and the temperature at the site is stable as compared to the temperature above the ground. Even if the temperature of the outside air is 50° C., the air drawn into the power conversion device 3 through the air lead-in tubes 20 is about 40° C. If a rated temperature of the power conversion device 3 is about 40° C., it is possible to adjust an ambient temperature within an appropriate range without depending on an air conditioning. It is also possible to adjust an air conditioning performance in accordance with the buried depth of the air lead-in tubes 20 in the ground 60. Further, since a lower portion of the solar cell panels 4 becomes the shade 52 in the solar power generation system, there is an advantage that it is not necessary to separately provide a structure for avoiding sunlight.

Figure 3:
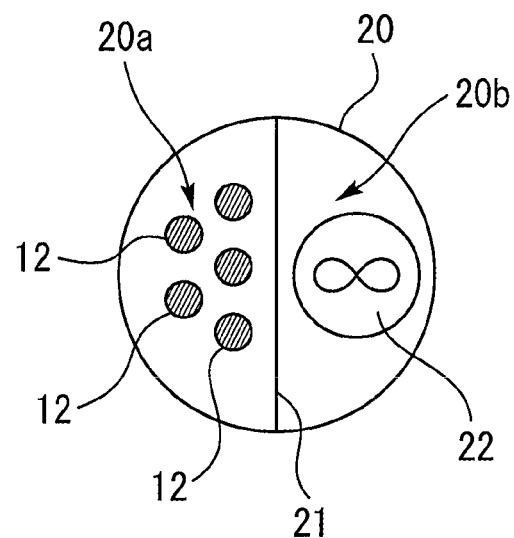
FIG. 3 is a diagram showing a configuration of an air lead-in tube of the solar power generation system according to the embodiment.

FIG. 3 is a diagram showing the configuration of the air lead-in tube 20 of the solar power generation system 1 according to the embodiment. An inner space of the air lead-in tube 20 is divided into two by a partition 21. A plurality of the power cables 12 are collectively accommodated on one side of the partition 21 of the air lead-in tube 20. The other side of the partition 21 of the air lead-in tube 20 is emptied so that the lead-in fan 22 draw air thereto.

Figure 4:
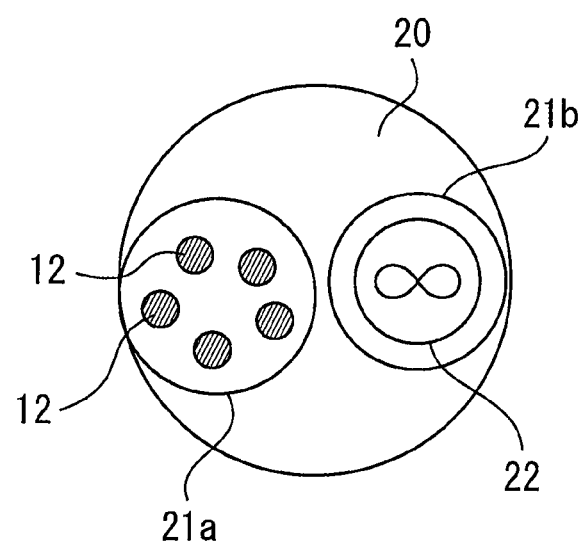
FIG. 4 is a diagram showing the configuration of the air lead-in tube of the solar power generation system according to a modification of the embodiment.

FIG. 4 is a diagram showing the configuration of the air lead-in tube 20 of the solar power generation system 1 according to a modification of the embodiment. Instead of the partition 21, a first small pipe 21a and a second small pipe 21b may be inserted through the air lead-in tube 20.

The building 2 is a container house in which the power conversion device 3 being an inverter for solar power generation is housed. If the building 2 is only provided with a conventional ventilation structure, a temperature control performance in the building 2 may be insufficient in a high temperature environment. If the temperature control by the conventional ventilation structure is insufficient, a derating operation such as lowering the power of the power conversion device 3 may be required. This is because the calorific value of the power conversion device 3 is considerably larger than the calorific value assumed in a typical ventilation structure.

For example, when the power conversion device 3 is installed in a high-temperature region having an ambient temperature such as 50° C., a protective operation such as putting a restriction on power limit at a constant temperature or higher (e.g., 40° C. or higher) was sometimes required. There was also a problem that the air conditioning equipment for cooling was required because the ventilation structure was insufficient from a view point of carrying out the rated operation. An introduction of the air conditioning equipment such as an air conditioner should be avoided as much as possible for various reasons such as cost and maintenance. There was a request to ensure the rated operation without using the air conditioning even in a situation where the temperature of the outside air is 50° C.

In this respect, according to the embodiment, it is possible to lower a room temperature of the building 2 than the outside air by, for example, about 10° C. without using the air conditioning. As a result, it is possible to eliminate the operational constraint of the power conversion device 3 and to perform more efficient power generation. In addition, according to embodiment, since the air lead-in tube 20 is shared with a pipe for drawing in the power cable 12, additional construction for an existing facility is not necessary, and the economical merit is also large.

Further, according to the embodiment, it is possible to suppress entry of dust from the outside since the outside air is introduced from the underfloor portion. Most of the high-temperature regions are arid areas, where clogging of a ventilation by dust and entry of dust into a device are feared. In this respect, according to the embodiment, it is possible to avoid the problems such as the clogging because the outside air is introduced from the underfloor pipe.

Note that an installation environment of the solar power generation system 1 according to the embodiment is not limited. The installation region of the solar power generation system 1 is not limited to the high-temperature region, and may be a cold region or an ordinary-temperature region. In the cold region, the temperature of the ground 60 is stable and a sufficiently deep position of the ground 60 is warmer than the temperature of the outside air. Therefore, it is possible to manage the temperature of the power conversion device 3 by introducing air having a temperature higher than the temperature of the outside air into the building 2 through the air lead-in tube 20.

Figure 5:
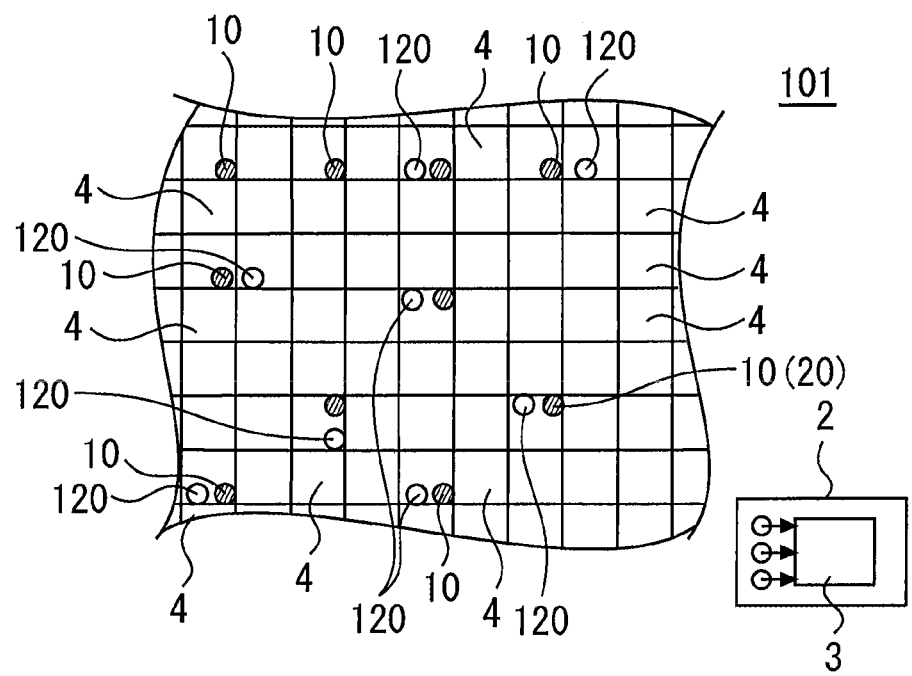
FIG. 5 is a plan view schematically showing the configuration of the solar power generation system according to another modification of the embodiment.
Figure 6:
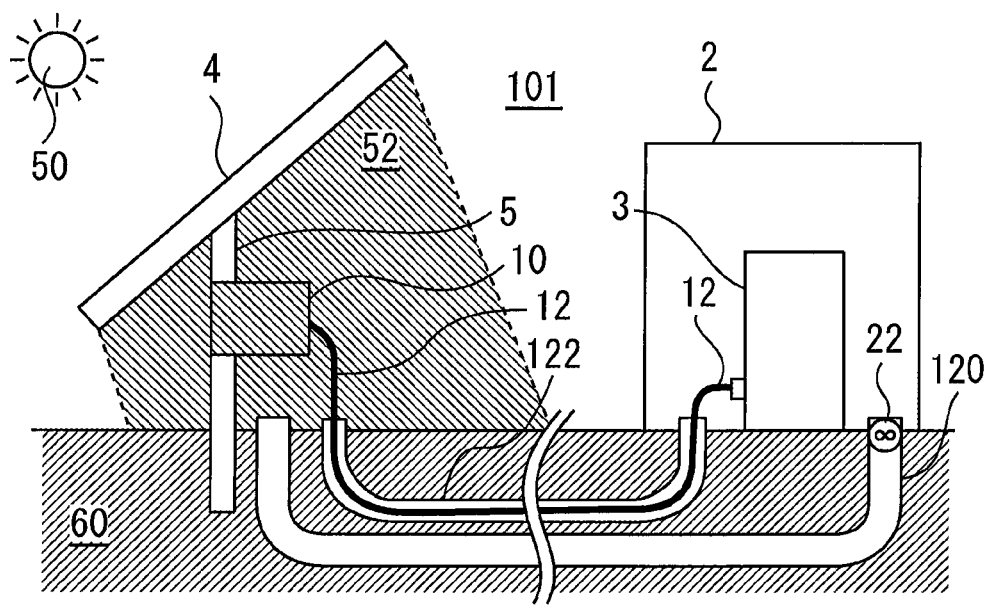
FIG. 6 is the side sectional view specifically showing the configuration of the solar power generation system according to the modification of the embodiment.

FIG. 5 is a plan view schematically showing the configuration of the solar power generation system according to another modification of the embodiment. FIG. 6 is a side cross-sectional view specifically showing a configuration of a solar power generation system 101 according to the modification of the embodiment. In this modification, the power cable pipes 122 are provided separately from the air lead-in tubes 20. A plurality of power cable pipes 122 are laid in parallel. The power cable pipes 122 are buried in the ground 60 to house the power cables 12. As described above, the power cable pipes 122 dedicated to the cabling and the air lead-in tube 20 dedicated to the air-drawing may be separately buried.

Figure 7:
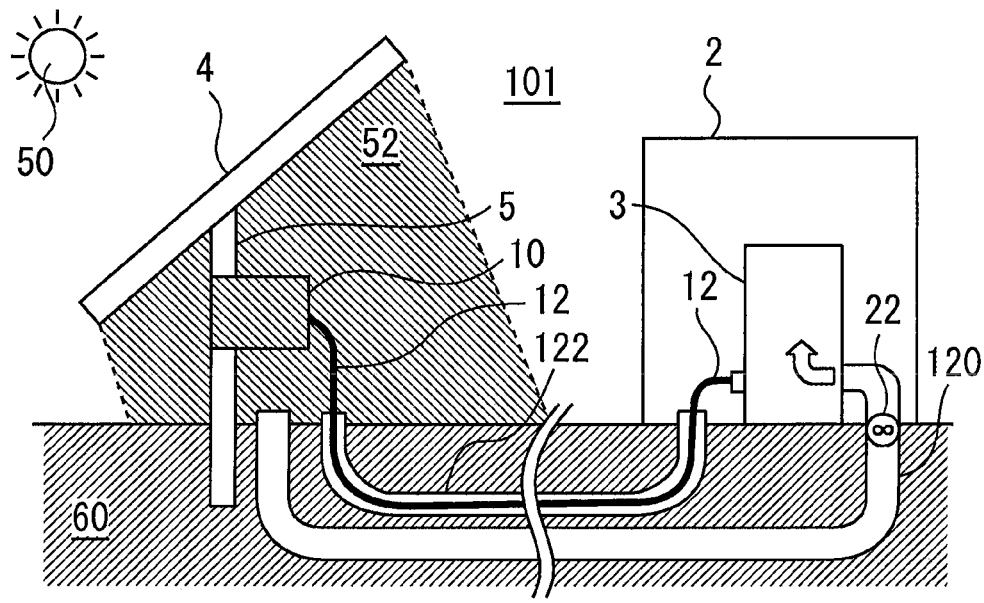
FIG. 7 is the side sectional view specifically showing the configuration of the solar power generation system according to still another modification of the embodiment.

FIG. 7 is a side cross-sectional view specifically showing a configuration of the solar power generation system 101 according to still another modification of the embodiment. In the system configuration of FIG. 6, the "lead-in part" of the air lead-in tube 20 may communicate with the interior of the housing of the power conversion device 3.

Figure 8:
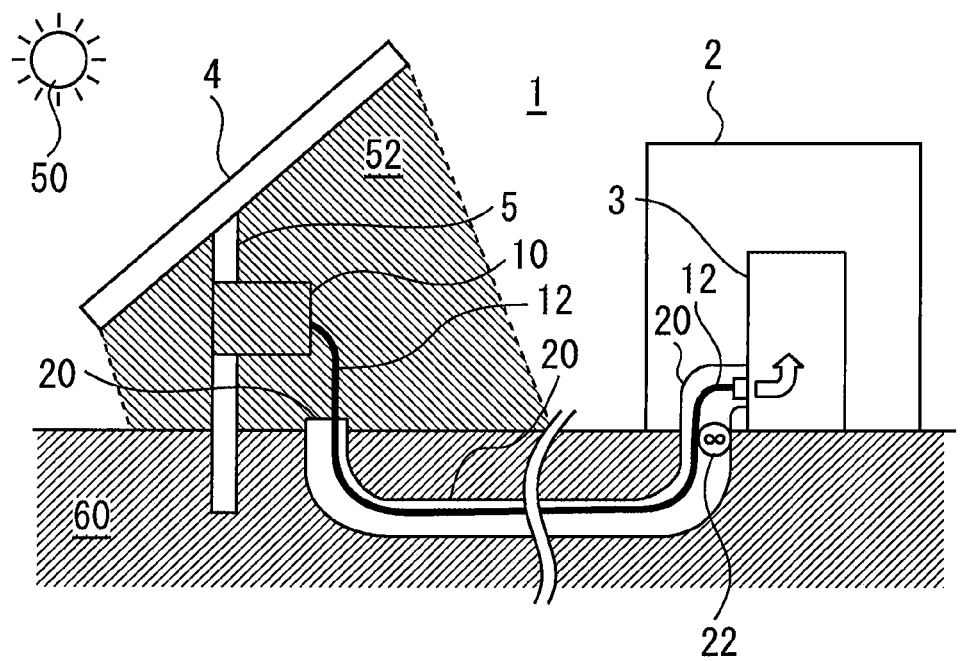
FIG. 8 is the side sectional view specifically showing the configuration of the solar power generation system according to yet another modification of the embodiment.

FIG. 8 is a side cross-sectional view specifically showing a configuration of the solar power generation system 1 according to yet another modification of the embodiment. In the system configuration of FIG. 2, the "lead-in part" of the air lead-in tube 20 may communicate with the interior of the housing of the power conversion device 3.

Figure 9:
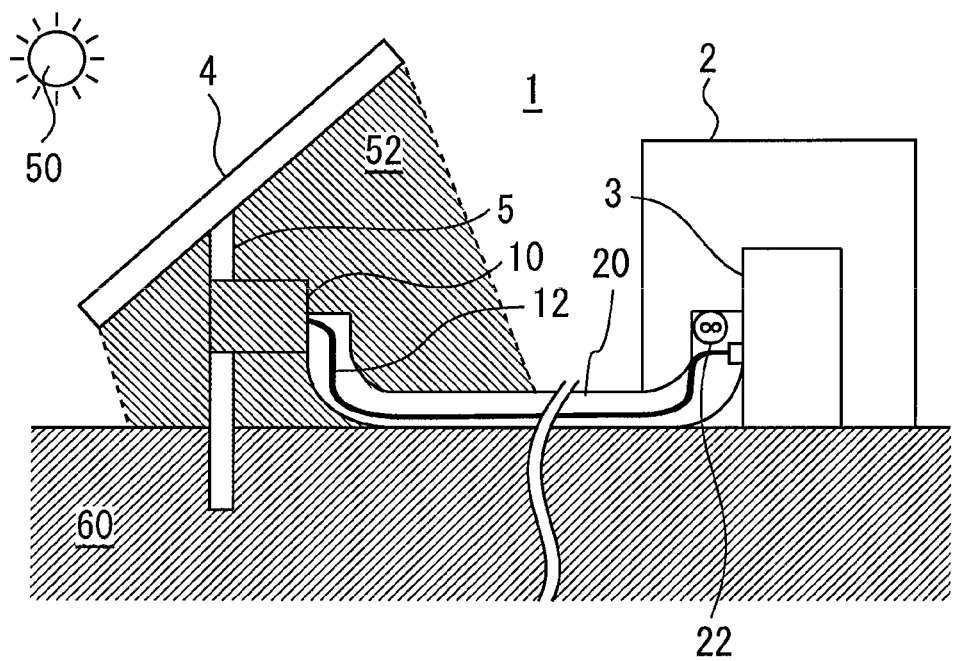
FIG. 9 is the side sectional view specifically showing the configuration of the solar power generation system according to further modification of the embodiment.

FIG. 9 is a side cross-sectional view specifically showing a configuration of the solar power generation system 1 according to further modification of the embodiment. In the system configuration of FIG. 2, the "heat exchange part" does not have to be buried in the ground 60. The heat exchange part may be laid so as to crawl on the ground surface such that it is hidden by the shade 52 on the back side of the solar cell panels 4. In the modification shown in FIG. 9, a further modification may be made in which a separate power cable pipe 122 is provided. In this case, the power cable pipe 122 may be buried in the ground 60 or may be laid so as to crawl the ground surface.

REFERENCE SIGNS LIST

1, 101 Solar power generation system 2 Building 3 Power conversion device 4 solar cell panel 5 Base 10 Power collection box 12 Power cable 20 Air lead-in tube 21 Partition 21*a* First small pipe 21*b* Second small pipe 22 Lead-in fan 50 Sun 52 Shade 60 Ground 122 Power cable pipe

The invention claimed is:

1. A solar power generation system, comprising:
   a solar cell panel installed in a ground surface;
   a power conversion device configured to convert direct current power received from the solar cell panel via a power cable into alternate current power; and
   a tube including:
      a heat exchange part laid on the ground surface in a shade on a back side of the solar cell panel or buried in a ground on the back side;
      a first opening part which communicates with the heat exchange part;
      a second opening part which communicates with the heat exchange part and opens inside the power conversion device or inside a building in which the power conversion device is installed; and
      a sucking means configured to send air inside the heat exchange part to an interior of the power conversion device or the building,
   wherein an internal space of the tube is bisected into a first and a second space along a longitudinal direction of the tube,
   the power cable is housed in the first space of the internal space, and
   the sucking means is housed in the second space of the internal space.

2. The solar power generation system according to claim 1, wherein the heat exchange part is buried in the ground at a depth equal to or greater than 1 meter.

3. The solar power generation system according to claim 1, wherein the sucking means includes using a lead-in fan which is configured to draw air to the lead-in part through the heat exchange part.

4. A solar power generation system, comprising:
   a solar cell panel installed in a ground surface;
   a power conversion device configured to convert direct current power received from the solar cell panel via a power cable into alternate current power; and
   a tube including:
      a heat exchange part laid on the ground surface in a shade on a back side of the solar cell panel or buried in a ground on the back side;
      a first opening part which communicates with the heat exchange part;
      a second opening part which communicates with the heat exchange part and opens inside the power conversion device or inside a building in which the power conversion device is installed; and
      a fan configured to send air inside the heat exchange part to an interior of the power conversion device or the building,
   wherein an internal space of the tube is bisected into a first and a second space along a longitudinal direction of the tube,
   the power cable is housed in the first space of the internal space, and
   the fan is housed in the second space of the internal space.

5. The solar power generation system according to claim 1, wherein the first and second space are each independent tubes.

6. The solar power generation system according to claim 4, wherein the first and second space are each independent tubes.

7. The solar power generation system according to claim 1, wherein the internal space of the tube is bisected into the first and the second space along the longitudinal direction of the tube by a divider which splits the tube into two parts.

8. The solar power generation system according to claim 4, wherein the internal space of the tube is bisected into the first and the second space along the longitudinal direction of the tube by a divider which splits the tube into two parts.

* * * * *